United States Patent
Imura

[11] Patent Number: 5,917,235
[45] Date of Patent: Jun. 29, 1999

[54] SEMICONDUCTOR DEVICE HAVING LOC STRUCTURE, A SEMICONDUCTOR DEVICE LEAD FRAME, TAB LEADS, AND AN INSULATING TAB TAPE

[75] Inventor: Tomoo Imura, Tokyo, Japan

[73] Assignee: NEC Corporation, Tokyo, Japan

[21] Appl. No.: 08/912,466

[22] Filed: Aug. 18, 1997

[30] Foreign Application Priority Data

Aug. 20, 1996 [JP] Japan ..................................... 8-218762

[51] Int. Cl.⁶ .......................... H01L 23/495; H01L 23/48
[52] U.S. Cl. .......................... 257/669; 257/678; 257/673; 257/784; 257/666; 257/671; 257/674; 257/782; 257/783; 257/676
[58] Field of Search .................................... 257/678, 666, 257/669–674, 676, 690, 781–784, 787, 778

[56] References Cited

U.S. PATENT DOCUMENTS

| | | | |
|---|---|---|---|
| 5,068,712 | 11/1991 | Murakami et al. ...................... | 257/676 |
| 5,293,068 | 3/1994 | Kohno et al. ............................ | 257/676 |
| 5,587,607 | 12/1996 | Yasuda et al. ........................... | 257/784 |
| 5,677,566 | 10/1997 | King et al. ............................... | 257/666 |
| 5,710,457 | 1/1998 | Uno .......................................... | 257/676 |
| 5,780,923 | 7/1998 | Courtenay ................................ | 257/676 |

FOREIGN PATENT DOCUMENTS

| | | | |
|---|---|---|---|
| 2246125 | 10/1990 | Japan .............................. | H01L 21/60 |
| 582585 | 4/1993 | Japan .............................. | H01L 21/60 |

*Primary Examiner*—Alexander Oscar Williams
*Attorney, Agent, or Firm*—Hayes, Soloway, Hennessey, Grossman & Hage, P.C.

[57] ABSTRACT

A semiconductor device with a LOC structure having a semiconductor device lead frame, TAB leads, and an insulating TAB tape, wherein the semiconductor device lead frame has a plurality of leads and is formed by fixing a semiconductor element on one surface side of the leads through insulating tapes. The leads are arranged to correspond to electrodes of the semiconductor element, wherein the TAB leads electrically connect the leads of the semiconductor device lead frame and the electrodes on the semiconductor element, and wherein the insulating TAB tape has electrical insulating characteristics and is fixed on the other surface side of the leads of the semiconductor device lead frame to surround a group electrodes of the semiconductor element, the insulating TAB tape serving to hold the TAB leads to be isolated from each other.

5 Claims, 8 Drawing Sheets

SEMICONDUCTOR DEVICE HAVING LOC STRUCTURE, A SEMICONDUCTOR DEVICE LEAD FRAME, TAB LEADS, AND AN INSULATING TAB TAPE

BACKGROUND OF THE INVENTION

1. Field of the Invention

The present invention relates to a semiconductor device and a manufacturing method therefor and, more particularly, to a semiconductor device having a LOC structure and a manufacturing method therefor.

2. Description of the Prior Art

Figure 1A:
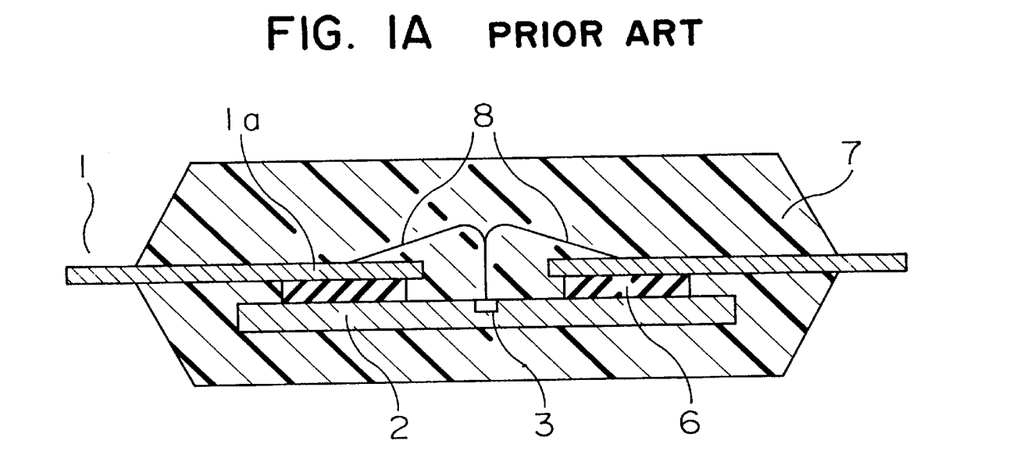
FIGS. 1A and 1B are sectional and plan views, respectively, of a semiconductor device having a conventional LOC structure.
Figure 1B:
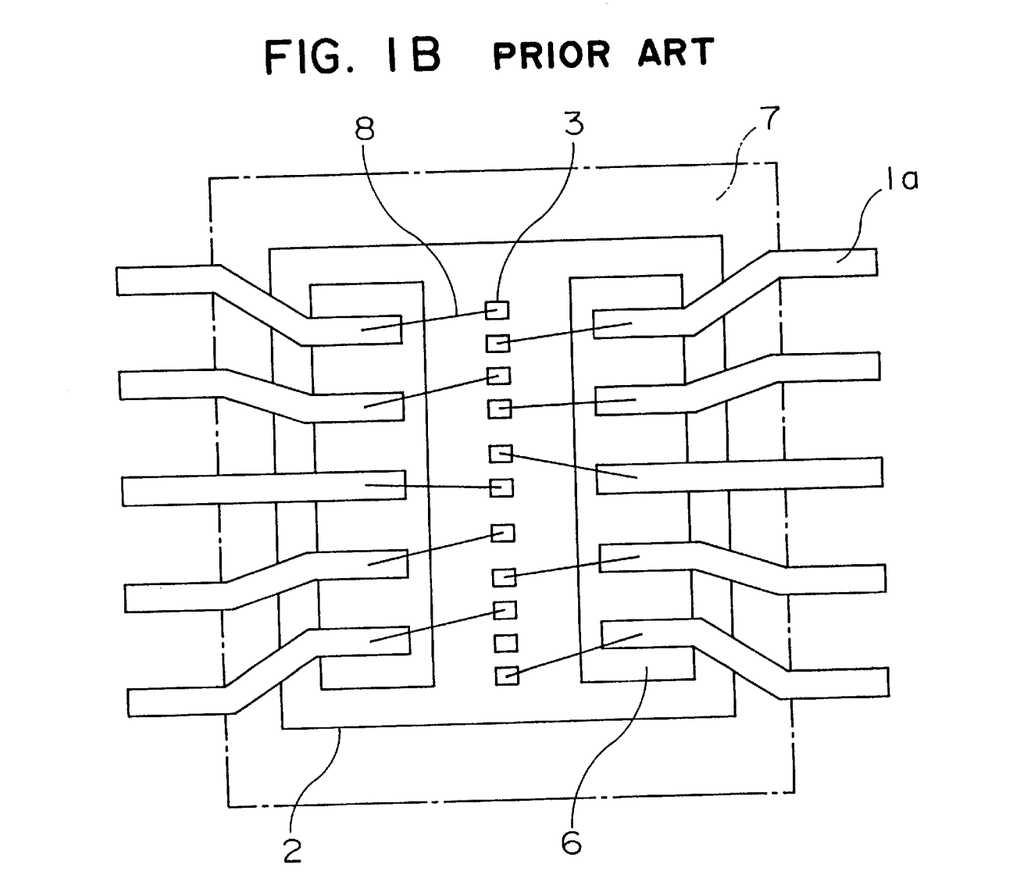

FIG. 1A is a sectional view of a semiconductor device having a conventional LOC structure, and FIG. 1B is a plan view of the same. This structure is effective for accommodating a large-capacity, multi-functional, large-size semiconductor element (to be referred to as a chip hereinafter) in a package. As shown in FIGS. 1A and 1B, a chip 2 is fixed to the lower surfaces of inner leads 1a of a semiconductor device lead frame 1 (to be referred to as a lead frame hereinafter) by insulating adhesive tapes 6 such that its circuit-formed surface faces the insulating tapes 6. Electrodes 3 (to be referred to as pads hereinafter) on the chip 2 and the inner leads 1a are electrically connected to each other in accordance with wire bonding using gold wires 8 (to be referred to as wires hereinafter).

Reference numeral 7 denotes an encapsulating resin that hermetically encapsulates the chip 2.

In this conventional LOC structure, the connecting shape (to be referred to as the loop shape hereinafter) of the wires 8 is such that the wires 8 extend above the inner leads 1a, as shown in FIG. 1A, and has a height of several ten to several hundred plus $\mu$m, which interferes with meeting a demand for a lower-profile semiconductor device.

Figure 2:
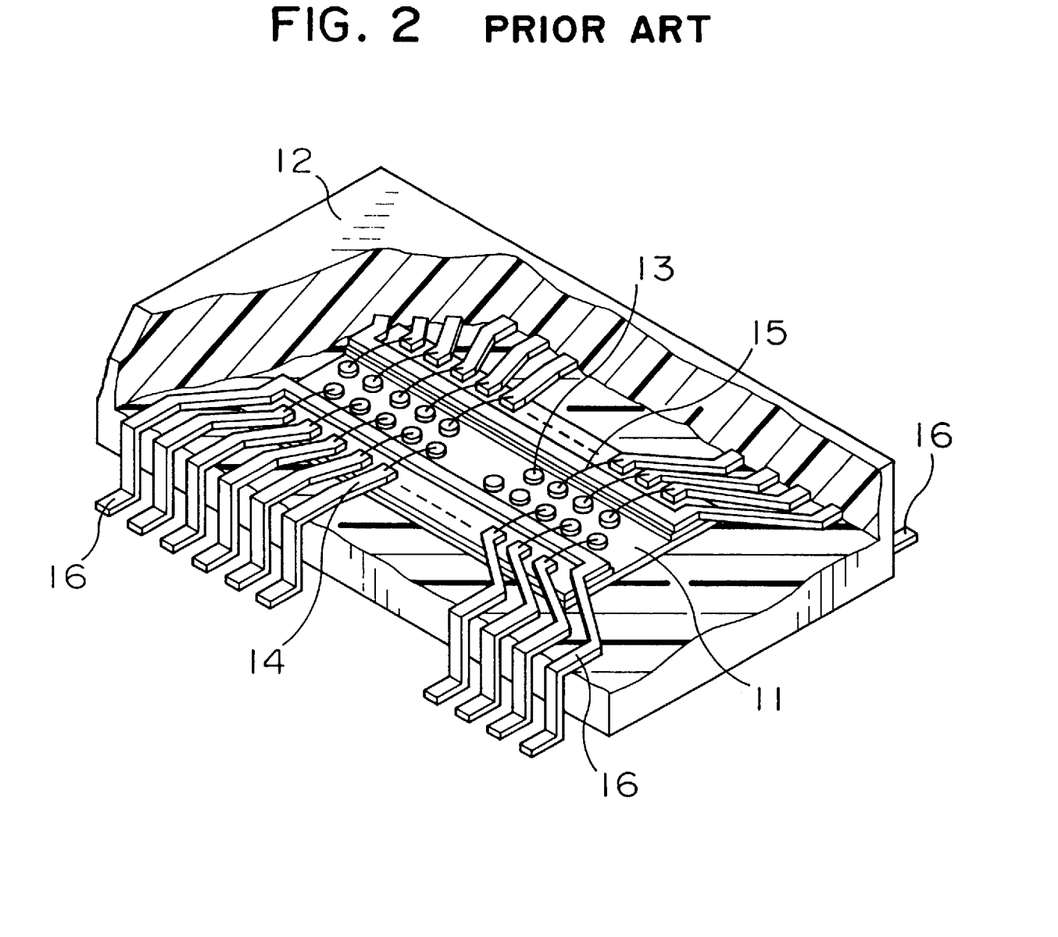
FIG. 2 is a perspective view showing the internal structure of a semiconductor device having a conventional LOC structure.

FIG. 2 is a perspective view of the internal structure of a semiconductor device having a conventional LOC structure disclosed in, e.g., Japanese Unexamined Patent Publication No. 2-246125. Referring to FIG. 2, pads 13 including power supply pads, ground pads, and signal pads are arranged in an array at the center of the circuit-formed surface of a large-size chip 11 encapsulated with an encapsulating resin 12 along the longitudinal direction.

A plurality of power supply pads and a plurality of ground pads are arranged in order to reduce electric noise. A plurality of leads 14 extend onto the chip 11, and the leads 14 and predetermined pads 13 are electrically connected to each other through wires 15.

Leads 16 at the two ends of the chip 11 in the longitudinal direction thereof are connected to each other (these leads will be referred to as common leads hereinafter). The common leads 16 are used as power supply leads and ground leads that are connected to the pads 13 at a plurality of portions. The signal leads 14 among the plurality of leads 14, and the signal pads 13 are electrically connected to each other through wires across the common leads 16.

Figure 3:
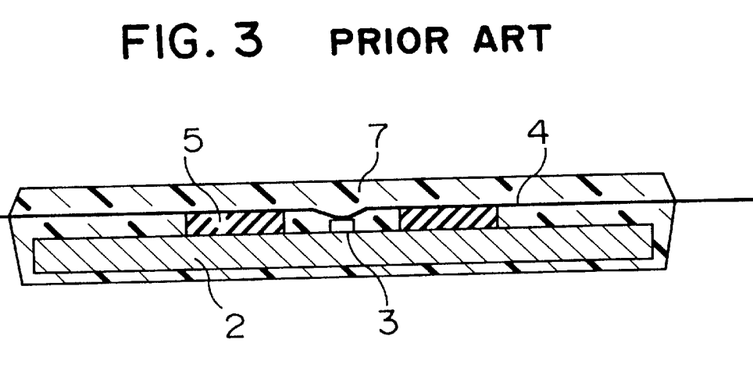
FIG. 3 is a sectional view of a semiconductor device having a conventional LOC structure using TAB tapes.

FIG. 3 is a sectional view of a semiconductor device using TAB (Tape Automated Bonding) tapes. In this structure, a chip 2 is fixed to the lower surfaces of TAB tapes 5 that hold TAB leads 4. One end of each TAB lead 4 and a corresponding pad 3 of the chip 2 are electrically connected to each other, and the other end of each TAB lead 4 projects from an encapsulating resin 7 to extend to the outside.

Japanese Unexamined Patent Publication No. 5-82585 discloses a semiconductor device using TAB tapes and TAB leads. In this semiconductor device, pads and the TAB leads are connected to each other, and a plurality of power supply pads and a plurality of ground pads can be connected to the TAB leads. This improves the electrical characteristics of the semiconductor element.

In the semiconductor device having the conventional LOC structure shown in FIGS. 1A and 1B, the leads 1a and the pads 3 are connected to each other through the wires 8. Due to limitations on the manufacturing method, the wires 8 must have a certain loop height. Accordingly, it is very difficult to meet a recent demand for a lower-profile semiconductor device.

In the semiconductor device having the conventional LOC structure shown in FIG. 2, it is indispensable to connect the plurality of power supply pads 13 and the plurality of ground pads 13 that aim at improving the electrical characteristics, e.g., a decrease in power supply noise, to the power supply leads 16 and the ground leads 16, so that the packaging degree and the number of functions of the semiconductor device increase. However, other signal pads 13 and other leads 14 must be connected to each other through wires 8 across the common leads 16. For this purpose, the loop height must be increased accordingly so that the wires 8 and the common leads 16 may not come into contact with each other. Therefore, the semiconductor device cannot have a low profile.

In order to manufacture products having different functions by using the same chips and to reduce the manufacturing cost of semiconductor devices, at least one or more pads that effect diversion into different products are arranged on the chip. Different combinations of connection of these pads with power supply leads or ground leads allow diversion into several types of products. An example of the difference in product function includes the count of data that can be input/output simultaneously in the case of DRAMs.

Figure 4:
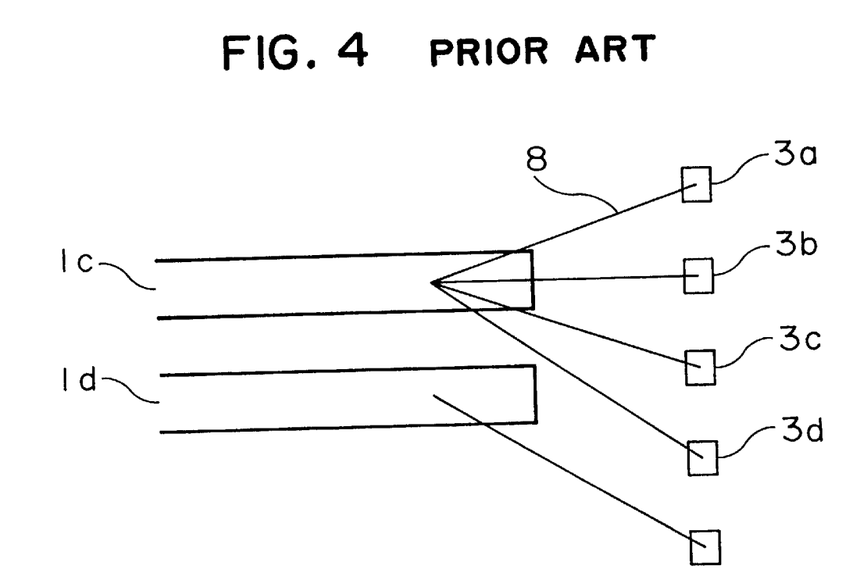
FIG. 4 is a plan view of a semiconductor device having a conventional LOC structure, in which product function diversion is attained by wire bonding.

Conventionally, these pads and leads are connected to each other by wire bonding, which will be described with reference to FIG. 4. Assume that in order to manufacture a product having a function of type I, a lead 1c must be connected to pads 3b and 3c.

Assume that in order to manufacture a product having a function of type II by using the same chip as that used for type I products, the lead 1c must be connected to pads 3a and 3d. In this case, a wire 8 that connects the lead 1c and pad 3d extends above a lead 1d adjacent to the lead 1c, and the lead 1d and the wire 8 may contact each other. Therefore, connection of the lead 1c and the pad 3d through the wire 8 becomes impossible.

Therefore, in order to manufacture the products of types I and II, separate lead frames must be prepared considering the different pad arrangements and wire bonding. Even though the same chips are used, several types of lead frames must be prepared. This hinders use of a common lead frame.

In the semiconductor device shown in FIG. 3 which uses the TAB tapes 5 and the TAB leads 4 and realizes a low profile, the TAB leads 4 extending to the outside of the package deform easily as they are metal foils having a thickness of about several ten $\mu$m. This semiconductor device is very difficult to handle during the manufacture or when being mounted on a board.

SUMMARY OF THE INVENTION

The present invention has been made in order to solve the above problems of the conventional technique, and has as its object to provide a semiconductor device having a LOC structure, which realizes a low profile by establishing electrical connection between the inner leads and the chip electrodes in accordance with the TAB scheme, and a manufacturing method therefor.

In order to achieve the above object, according to the first aspect of the present invention, there is provided a semiconductor device with a LOC structure having a semiconductor device lead frame, TAB leads, and an insulating TAB tape, wherein the semiconductor device lead frame has a plurality of leads and is formed by fixing a semiconductor element on one surface side of the leads through insulating tapes, the plurality of leads being arranged to correspond to electrodes of the semiconductor element, the TAB leads electrically connect the leads of the semiconductor device lead frame and the electrodes on the semiconductor element, and the insulating TAB tape has electrical insulating characteristics and is fixed on the other surface side of the leads of the semiconductor device lead frame to surround a group of electrodes of the semiconductor element, the insulating TAB tape serving to hold the plurality of TAB leads to be isolated from each other.

In the first aspect described above, the semiconductor device lead frame has at least one common lead held at a power supply voltage or ground voltage, and the insulating TAB tape is fixed on the common lead, and the electrodes on the semiconductor element and the leads are electrically connected to each other through the TAB leads.

In the first aspect described above, the insulating TAB tape is formed with a slit that enables connection of an arbitrary TAB lead and an arbitrary lead, and connection of an arbitrary electrode on the semiconductor element and an arbitrary lead is performed through the slit in accordance with a function of the semiconductor element.

According to the second aspect of the present invention, there is provided a manufacturing method for a semiconductor device having at least an element mounting step, a TAB tape adhering step, and a connecting step, wherein the element mounting step comprises of fixing a semiconductor element on one surface side of a plurality of leads of a semiconductor device lead frame through insulating tapes, the TAB tape adhering step comprises of fixing an insulating TAB tape having electrical insulating characteristics on the other surface side of the leads of the semiconductor device lead frame to surround a group of electrodes on the semiconductor element, and the connecting step comprises of electrically connecting the leads of the semiconductor device lead frame and the electrodes on the semiconductor element to each other by using TAB leads that are held by the insulating TAB tape so as to be electrically insulated from each other.

According to the third aspect of the present invention, there is provided a manufacturing method for a semiconductor device having at least an element mounting step, a TAB tape adhering step, and a connecting step, wherein the element mounting step comprises of fixing a semiconductor element on one surface side of a plurality of leads of a semiconductor device lead frame through insulating tapes, the TAB tape adhering step is a process of fixing an insulating TAB tape having electrical insulating characteristics on the other surface side of the leads of the semiconductor device lead frame to surround a group of electrodes on the semiconductor element, the insulating TAB tape has a slit that allows connection of an arbitrary TAB lead and an arbitrary lead, and the connecting step comprises of performing connection of an arbitrary electrode on the semiconductor element and an arbitrary lead through the slit in accordance with a function of the semiconductor element by using the TAB leads that are held by the insulating TAB tape so as to be electrically insulated from each other.

According to the present invention, the pads on the chip and the leads are electrically connected to each other through the TAB leads. Therefore, the thickness above the leads required for TAB connection is reduced as thin as several ten $\mu$m corresponding to the total thickness of the TAB leads and TAB tape, and the resin thickness above the leads can be made thin, thereby obtaining a lower-profile semiconductor device.

A plurality of power supply pads and ground pads that improve the electrical characteristics, and the leads are electrically connected to the common leads through the TAB leads. The TAB leads that connect the signal pads and signal leads to each other extend across the common leads through the insulating TAB tape, to electrically connect the signal pads and the signal leads to each other not to bring them into electrical contact with the common leads. Regarding the thickness above the leads, the thickness of the TAB leads and TAB tape can be reduced as thin as several ten $\mu$m, thereby obtaining a lower-profile semiconductor device having superior electrical characteristics.

Furthermore, if the TAB leads on the TAB tape are arranged by taking into account the specifications for function diversion of products, electrical connection between arbitrary pads and arbitrary leads can be made through the TAB leads in accordance with function diversion of desired products. Hence, common TAB leads, TAB tape, and lead frame can be used.

If the leads have at least one common lead, the TAB tape having the TAB leads is fixed on this common lead, and signal pads and signal leads, a plurality of power supply pads and power supply leads serving as the common leads, or ground pads and ground leads are connected to each other through the TAB leads, then they can be connected across the common lead. As a result, a low-profile semiconductor device having excellent electrical characteristics can be obtained.

If the TAB lead pattern on the TAB tape is formed by taking into account the wiring design of the chip, arbitrary pads and arbitrary leads can be electrically connected to each other, and a low-profile semiconductor device can be obtained while using the same lead frame and the same TAB tape.

The above and many other objects, features and advantages of the present invention will become manifest to those skilled in the art upon making reference to the following detailed description and accompanying drawings in which preferred embodiments incorporating the principles of the present invention are shown by way of illustrative example.

BRIEF DESCRIPTION OF THE DRAWINGS

FIGS. 5A and 5B show the first embodiment of the present invention, in which FIG. 5A is a plan view.

FIGS. 9A and 9B are schematic sectional views showing part of a manufacturing method for the third embodiment of the present invention, in which FIG. 9A shows a state before connection of the TAB leads and the leads, and FIG. 9B shows a state after this connection.

DETAILED DESCRIPTION OF PREFERRED EMBODIMENTS

Several preferred embodiments of the present invention will be described with reference to the accompanying drawings.

Figure 5A:
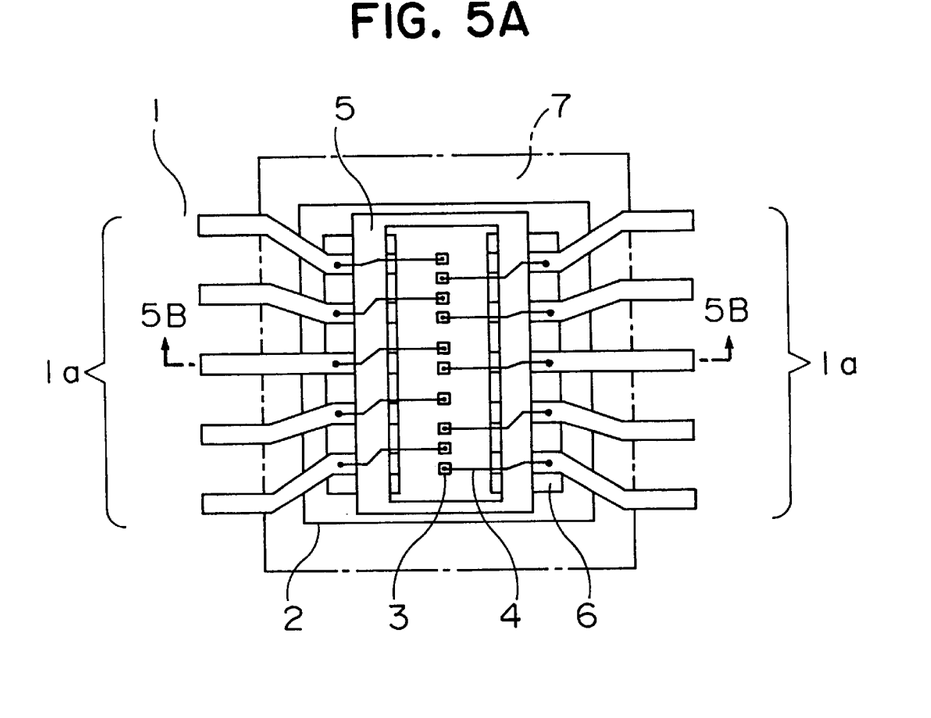
Figure 5B:
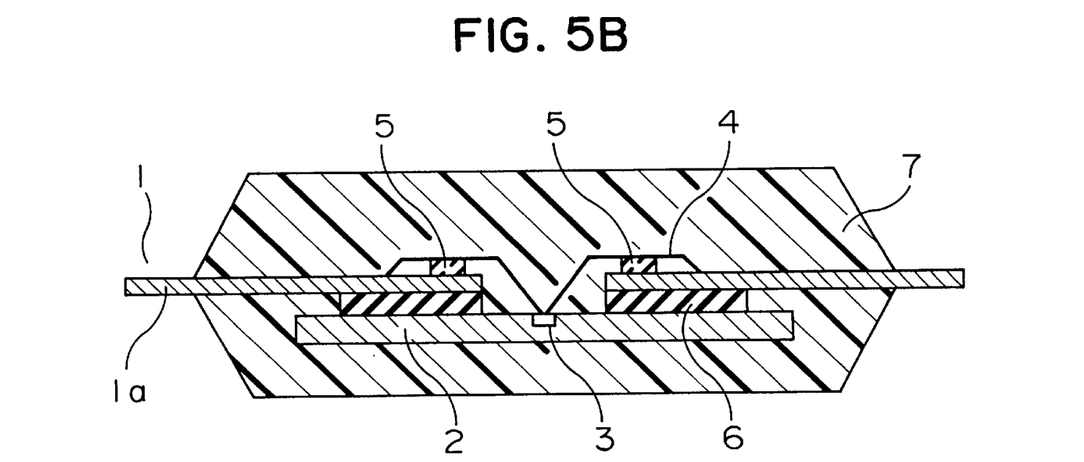
FIG. 5B is a sectional view taken along the line 5B—5B of FIG. 5A.

FIG. 5A is a plan view showing the first embodiment of the present invention, and FIG. 5B is a sectional view taken along the line 5B—5B of FIG. 5A.

Referring to FIGS. 5A and 5B, the first embodiment of the present invention has a lead frame 1, TAB leads 4, and an insulating TAB tape 5. The lead frame 1 has on its lower surface insulating tapes 6 for fixing a chip 2 on leads 1a, and leads 1a corresponding to pads 3 of the chip 2. The TAB leads 4 electrically connect the leads 1a and the pads 3 formed on the chip 2. The insulating TAB tape 5 is arranged on the surfaces of the leads 1a opposite to their surfaces where the insulating tapes 6 are arranged, and has an annular shape to surround the group of pads 3 on the chip 2. The TAB tape 5 fixes the TAB leads 4 at predetermined gaps so that they may not come into contact with each other.

The chip 2 is fixed to the lower surfaces of the leads 1a of the lead frame 1 by the insulating adhesive tapes 6 so that its circuit-formed surface faces the insulating tapes 6. The TAB tape 5 having the TAB leads 4 is fixed to the upper surfaces of the leads 1a. One and the other ends of each TAB lead 4 are connected to the corresponding lead 1a and the corresponding pad 3 on the chip 2, respectively, by bending. The leads 1a and the pads 3 are electrically connected to each other through the TAB leads 4.

In the manufacture of the semiconductor device according to the first embodiment of the present invention, a process (element mounting step) of fixing the chip 2 on one surface side of the plurality of leads 1a of the lead frame 1 through the insulating tapes 6 is performed. Subsequently, a process (TAB tape adhering step) of fixing the insulating TAB tape 5 having electrical insulating characteristics on the other surface side of the leads 1a of the lead frame 1 to surround the group of pads 3 on the chip 2 is performed. Then, a process (connecting step) of electrically connecting the leads 1a of the lead frame 1 and the group of pads 3 on the chip 2 to each other by using the TAB leads 4, that are held by the insulating TAB tape 5 so as to be electrically insulated from each other, is performed.

As described above, the characteristic feature of the first embodiment resides in the electrical connection of the leads 1a of the semiconductor device having the LOC structure and the pads 3 on the chip 2. According to the first embodiment, a height corresponding to a total thickness of about several ten μm of the TAB leads 4 and TAB tape 5 need only be ensured on the leads 1a, and the resin thickness of the encapsulating resin 7 formed on the leads 1a can be decreased. Therefore, a semiconductor device having a lower profile than that obtained in accordance with conventional electrical connection employing wire bonding can be obtained.

Figure 6:
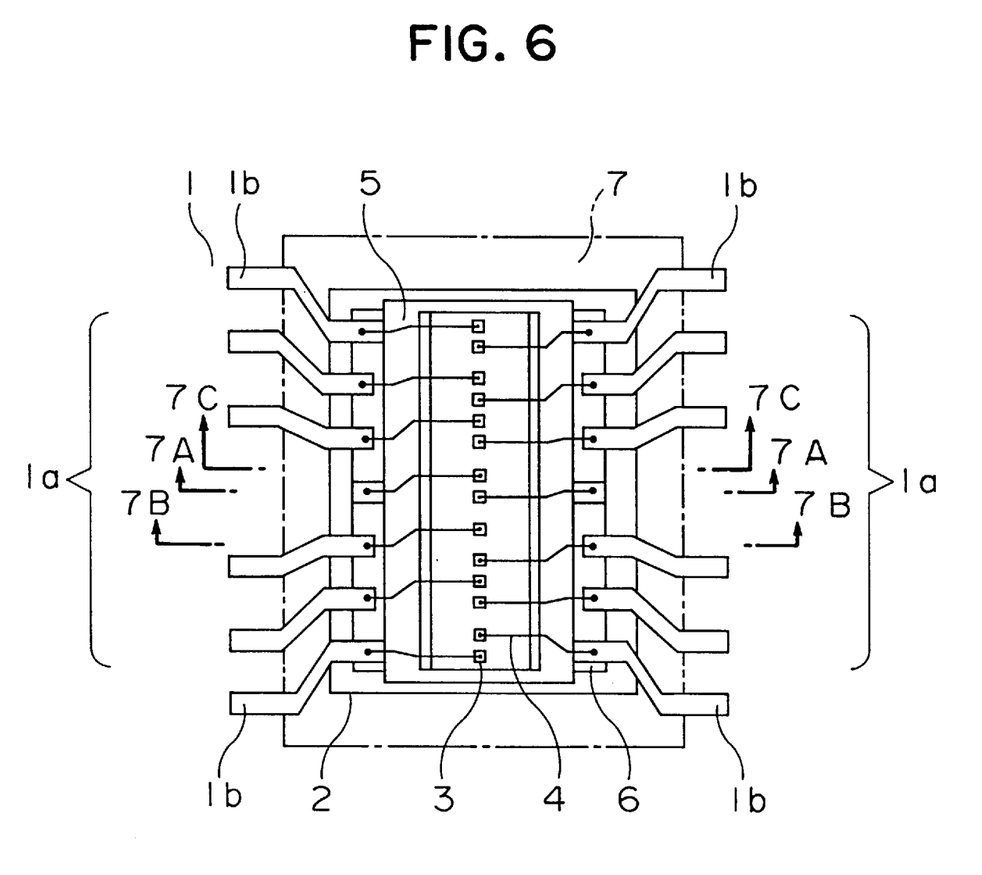
FIG. 6 is a plan view showing the second embodiment of the present invention.
Figure 7A:
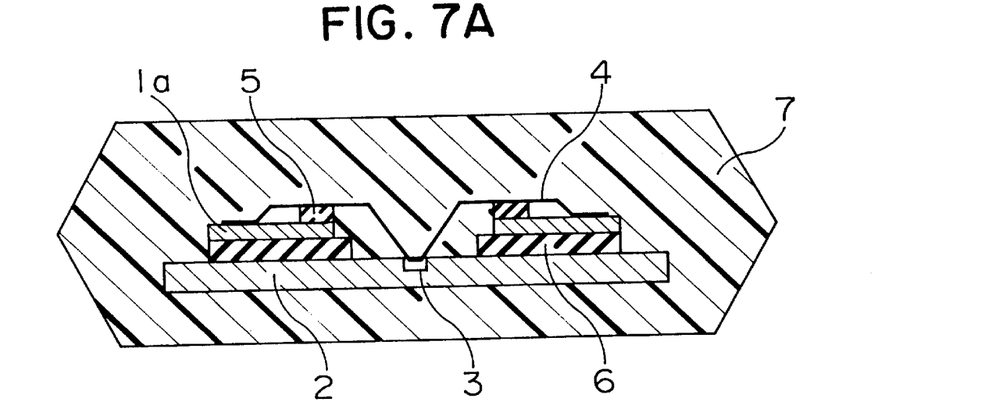
FIGS. 7A to 7C are sectional views taken along the lines 7A–7A', 7B–7B', and 7C–7C', respectively, of FIG. 6.
Figure 7B:
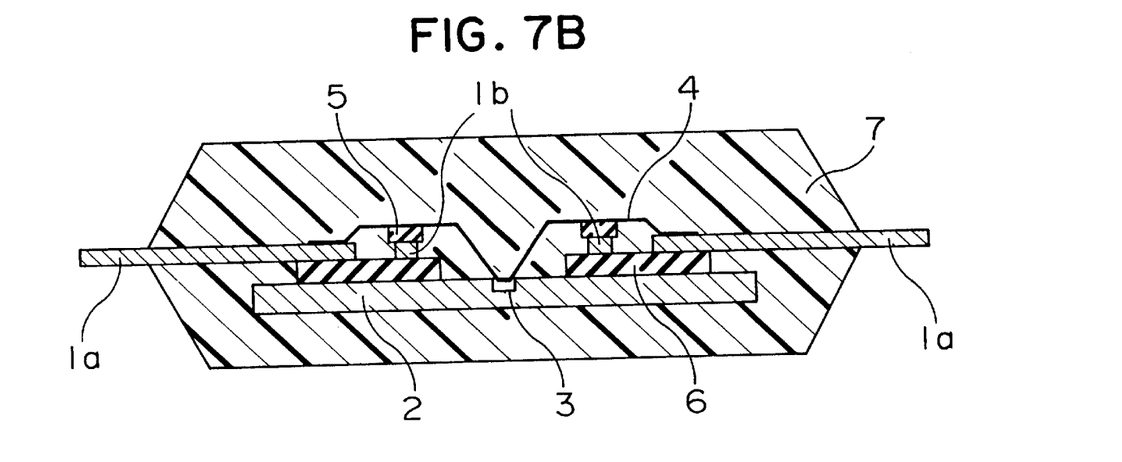
Figure 7C:
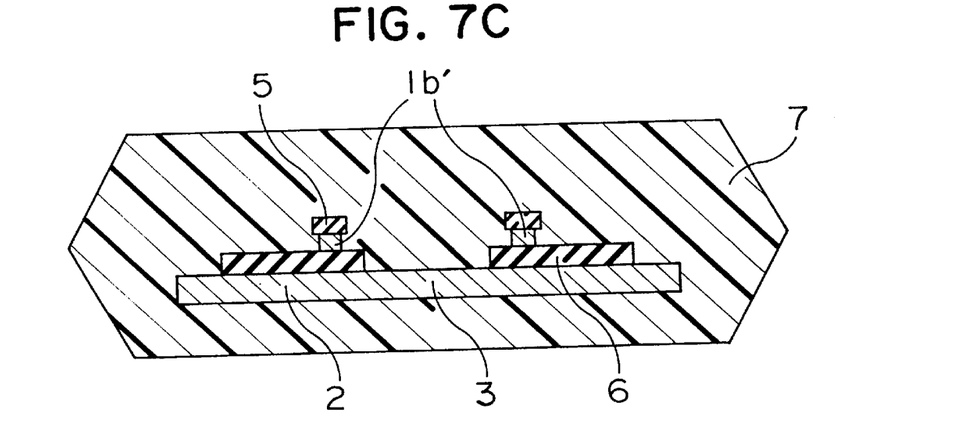

FIG. 6 is a plan view showing the second embodiment of the present invention, and FIGS. 7A to 7C are sectional views taken along the lines 7A–7A', 7B–7B', and 7C–7C', respectively, of FIG. 6.

Referring to FIGS. 6 to 7C, of leads 1a and 1b, common leads 1b arranged at the two ends of a chip 2 in the longitudinal direction thereof are connected to each other through conductive leads 1b', as shown in FIGS. 7B and 7C. An annular insulating TAB tape 5 is fixed on the common leads 1b and leads 1a to surround a group of pads 3 on the chip 2. TAB leads 4 that electrically connect the leads 1a and the pads 3 on the chip 2 are fixed on the annular insulating TAB tape 5 at predetermined gaps so that they may not come into contact with each other. The width of the annular insulating TAB tape 5 is larger than the width of the common leads 1b, so that the common leads 1b and the TAB leads 4, which are connected to the pads 3 on the chip 2 across the common leads 1b, are prevented from coming into contact with each other.

As described above, according to the second embodiment, electrical connection of the leads 1a and pads 3 on the chip 2 is performed in the same manner as in the first embodiment. According to the second embodiment, some TAB leads 4 that are electrically connected to the pads 3 on the chip 2 extend across the common leads 1b. As the insulating TAB tape 5 is interposed between these TAB leads 4 and the common leads 1b to electrically insulate them from each other, the TAB leads 4 can electrically connect the leads 1a and the pads 3 to each other to be electrically insulated from the common leads 1b.

Referring to FIGS. 6 to 7C, projections can be formed at arbitrary positions of the common leads 1b for the sake of connection with the TAB leads 4. These projections can be used as power supply connection leads or ground connection leads, and can be electrically connected to a plurality of power supply pads or ground pads through the TAB leads 4. This can improve the electrical characteristics of the semiconductor device. The resin thickness on the leads 1a and 1b can be maintained small in this second embodiment as well, thus obtaining a low-profile semiconductor device.

Figure 8:
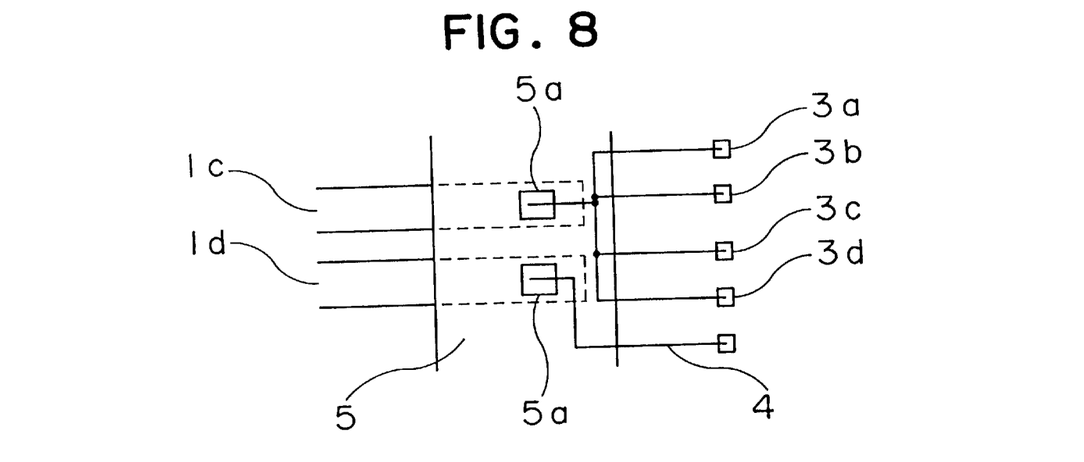
FIG. 8 is a plan view showing the third embodiment of the present invention.

A semiconductor device according to the third embodiment of the present invention will be described with reference to the plan view of FIG. 8. The basic constituent elements of the third embodiment are the same as those of the first embodiment. A TAB tape 5 fixed to the leads is formed with slits 5a at portions corresponding to the distal end portions of leads 1c and 1d. TAB leads 4 and the leads 1c and 1d are connected to each other through the slits 5a.

Figure 9A:
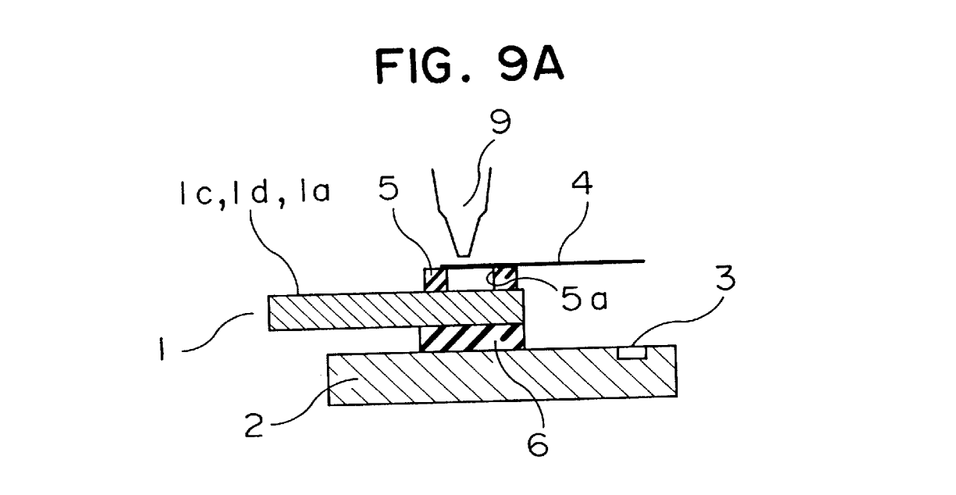

The connecting method shown in FIG. 8 will be described with reference to FIGS. 9A and 9B. A chip 2, a lead frame 1 having insulating tapes 6, and a TAB tape 5 having TAB leads 4 are assembled as shown in FIG. 9A. One end of each TAB lead 4 extends onto a corresponding pad 3 and is connected to it. The other end of each TAB lead 4 extends onto the opposing TAB tape 5 across the corresponding slit 5a.

Figure 9B:
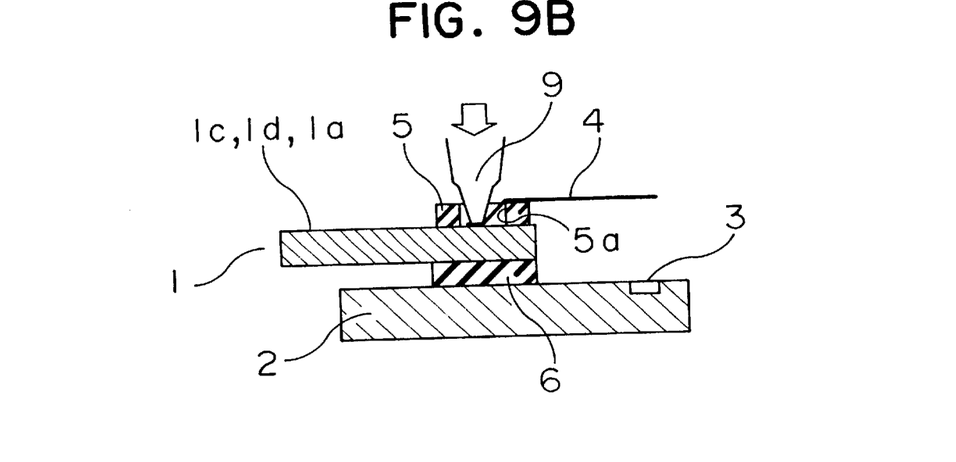

As shown in FIG. 9B, when connecting the TAB leads 4 and the corresponding leads 1c and 1d to each other, a bonding jig 9 is moved downward into the corresponding slit 5a from above, and the TAB leads 4 are pressed downward into the slit 5a with the bonding jig 9. In this process, the distal ends of the TAB leads 4 fall outside the TAB tape 5 to be inserted in the slit 5a, are bent, and are bonded to the leads 1c and 1d. In this manner, only the distal ends of the TAB leads 4 are easily inserted in the slit 5a with the downward pressure of the bonding jig 9, while the central portions of the TAB leads 4 fixed by the TAB tape 5 are kept fixed by the TAB tape 5.

In the manufacture of products having different functions by using the same chips, if the wiring patterns of the TAB leads 4 on the TAB tape 5 are designed by considering connection with pads that effect diversion into different functions, the same lead frames and the same TAB tapes can be used. This will be described with reference to FIG. 8. Assume that in order to manufacture a product having a function of type I, the lead 1c must be connected to pads 3b and 3c.

In this case, the pads 3b and 3c are connected to TAB leads 4 extending onto them, and the other ends of the TAB leads 4 located on the lead 1c are connected to the lead 1c through the slit 5a in accordance with the manufacturing method described above. At this time, the remaining pads (pads 3a and 3d in FIG. 8) are not connected to the lead 1c through the TAB leads 4. Assume that in order to manufacture a product having a function of type II, the lead 1c must be connected to the pads 3a and 3d. In this case, the pads 3a and 3d are connected to the TAB leads 4 extending onto them, and the other ends of the TAB leads 4 located on the lead 1c are connected to the lead 1c through the slit 5a in accordance with the manufacturing method described above. At this time, the TAB leads 4 on the remaining pads are not connected to the lead 1c through the TAB leads 4.

Figure 10A:
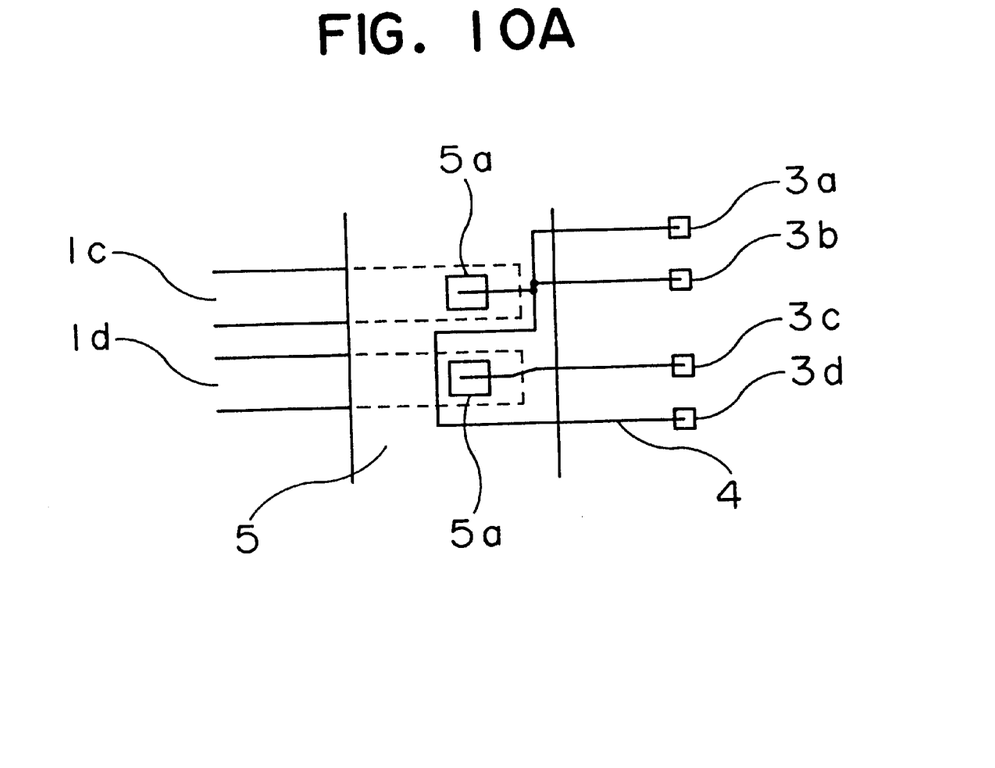
FIGS. 10A and 10B are plan views each showing the relationship between the pattern of the TAB leads and connection of the leads and pads in the third embodiment of the present invention.
Figure 10B:
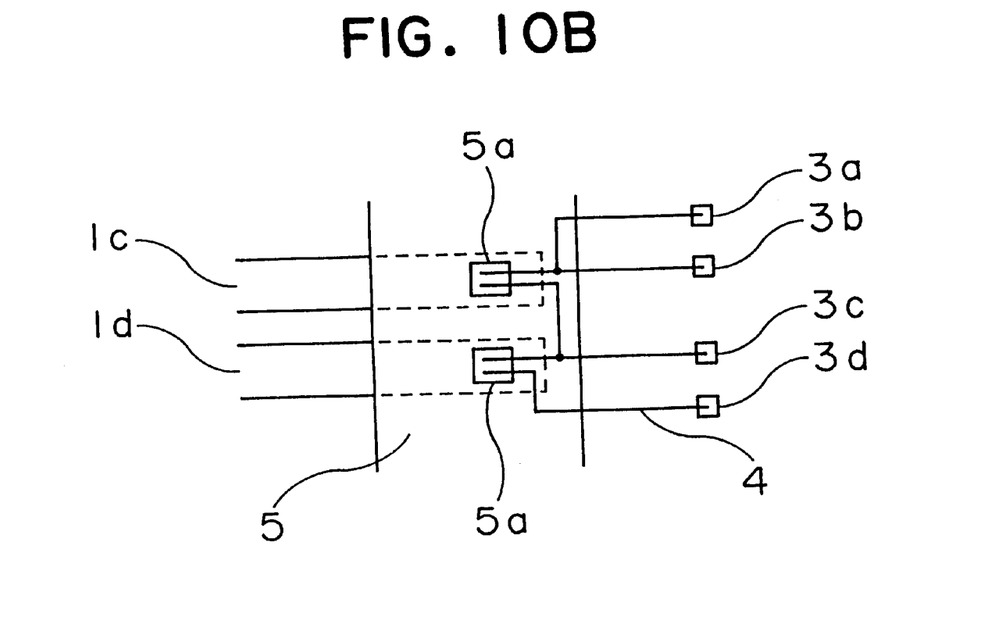

If the TAB leads 4 have a pattern as shown in FIG. 10A, the pads 3a and 3d can be connected to each other through the TAB lead 4, and this connection can be made across the lead 1d. Furthermore, if the TAB leads 4 have a pattern as shown in FIG. 10B, the same lead 1c can be connected to the pad 3c or 3b.

In this manner, according to the third embodiment as well, a lower-profile semiconductor device can be obtained. If the pattern of the TAB leads 4 on the TAB tape 5 is changed in various manners, an arbitrary pad can be electrically connected to an arbitrary lead.

What we claim is:

1. A semiconductor device with a LOC structure having a semiconductor device lead frame, TAB leads, and an insulating TAB tape, wherein
    said semiconductor device lead frame has a plurality of leads and is formed by fixing a semiconductor element on one surface side of said leads through insulating tapes, said plurality of leads being arranged to correspond to electrodes of said semiconductor element,
    said TAB leads electrically connect said leads of said semiconductor device lead frame and said electrodes on said semiconductor element, and
    said insulating TAB tape has electrical insulating characteristics and is fixed on the other surface side of said leads of said semiconductor device lead frame, said insulating TAB tape having an annular shape and being positioned to surround a group of electrodes on said semiconductor element, said insulating TAB tape serving to hold said plurality of TAB leads at predetermined gaps electrically insulated from each other.

2. A manufacturing method for a semiconductor device having at least an element mounting step, a TAB tape adhering step, and a connecting step, wherein
    the element mounting step comprises fixing a semiconductor element on one surface side of a plurality of leads of a semiconductor device lead frame through insulating tapes,
    the TAB tape adhering step comprises fixing an annular shaped insulating TAB tape having electrical insulating characteristics on the other surface side of said leads of said semiconductor device lead frame to surround a group of electrodes on said semiconductor element, and
    the connecting step comprises electrically connecting said leads of said semiconductor device lead frame and said electrodes on said semiconductor element to each other by using TAB leads that are held by said insulating TAB tape at predetermined gaps electrically insulated from each other.

3. A semiconductor device according to claim 1, wherein said semiconductor device lead frame has at least one common lead held at a power supply voltage or ground voltage, and
    said insulating TAB tape is fixed on said common lead, and said electrodes on said semiconductor element and said leads are electrically connected to each other through said TAB leads.

4. A semiconductor device with a LOC structure having a semiconductor device lead frame, TAB leads, and an insulating TAB tape, wherein
    said semiconductor device lead frame has a plurality of leads and is formed by fixing a semiconductor element on one surface side of said leads through insulating tapes, said plurality of leads being arranged to correspond to electrodes of said semiconductor element,
    said TAB leads electrically connect said leads of said semiconductor device lead frame and said electrodes on said semiconductor element, and
    said insulating TAB tape has electrical insulating characteristics and is fixed on the other surface side of said leads of said semiconductor device lead frame to surround a group of electrodes of said semiconductor element, said insulating TAB tape serving to hold said plurality of TAB leads electrically insulated from each other, wherein said insulating TAB tape is formed with a slit that enables connection of an arbitrary TAB lead and an arbitrary lead, and connection of an arbitrary electrode on said semiconductor element and an arbitrary lead is performed through said slit in accordance with a function of said semiconductor element.

5. A manufacturing method for a semiconductor device having at least an element mounting step, a TAB tape adhering step, and a connecting step, wherein
    the element mounting step comprises fixing a semiconductor element on one surface side of a plurality of leads of a semiconductor device lead frame through insulating tapes,
    the TAB tape adhering step comprises fixing an insulating TAB tape having electrical insulating characteristics on the other surface side of said leads of said semiconductor device lead frame to surround a group of electrodes on said semiconductor element,
    said insulating TAB tape has a slit that allows connection of an arbitrary TAB lead and an arbitrary lead, and
    the connecting step comprises performing connection of an arbitrary electrode on said semiconductor element and an arbitrary lead through said slit in accordance with a function of said semiconductor element by using said TAB leads that are held by said insulating TAB tape so as to be electrically insulated from each other.

* * * * *